Oct. 30, 1962 J. R. BIARD 3,061,799
FREQUENCY MODULATED MULTIVIBRATOR WITH A CONSTANT DUTY CYCLE
Filed Sept. 22, 1959
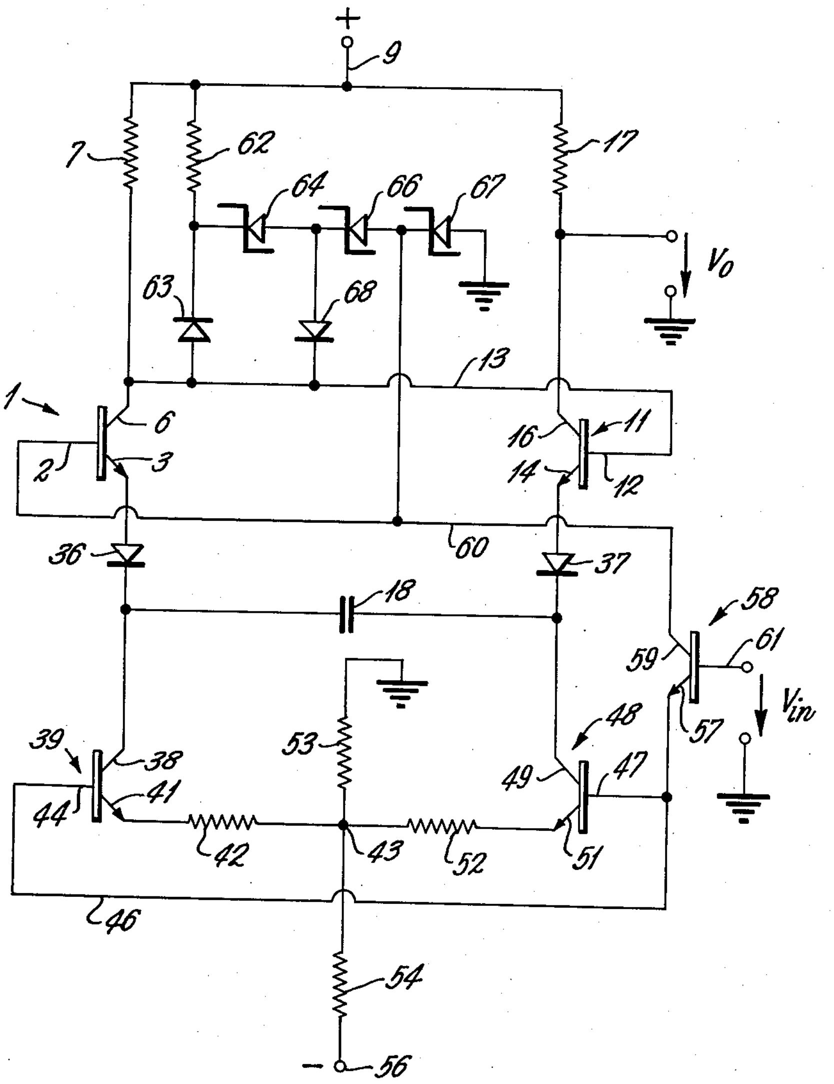
INVENTOR
J. R. Biard
BY Stevens, Davis, Miller & Mosher
ATTORNEYS

United States Patent Office 3,061,799
Patented Oct. 30, 1962

3,061,799

FREQUENCY MODULATED MULTIVIBRATOR WITH A CONSTANT DUTY CYCLE

James R. Biard, Richardson, Tex., assignor to Texas Instruments Incorporated, Dallas, Tex., a corporation of Delaware Filed Sept. 22, 1959, Ser. No. 841,551
5 Claims. (Cl. 332—14)

The present invention relates to a multivibrator circuit, and more particularly to a multivibrator circuit in which the frequency may be varied in accordance with an input signal.

An emitter or cathode coupled multivibrator circuit is employed as the oscillatory element of the frequency modulation circuit of the present invention. In an emitter coupled multivibrator, a capacitor is connected between the emitter electrodes of two transistors and the base electrode of one transistor is connected to the collector electrode of the other transistor, the other transistor having its base returned to a source of reference potential such as ground. In operation the transistors alternately conduct to generate the oscillations of the circuit. The voltage on the emitter of the transistor which is not conducting is dependent upon the voltage across the capacitor intercoupling the two emitter electrodes, and the charge on this capacitor is continuously changing as a result of the flow of a portion of the current from the conducting transistor. When the voltage on the emitter of the non-conducting transistor reaches that of the base electrode of the non-conducting transistor, this transistor starts conducting, and due to regenerative action through the base-collector circuits of the two transistors, the previously conducting transistor stops conducting, and the previously non-conducting transistor conducts fully. The charge on the capacitor then starts to change in the opposite direction. This action continues until the charge is sufficiently changed to cause the potential of the emitter electrode of the now non-conducting transistor to equal the potential of the base electrode of this transistor, in which case switching again occurs.

The frequency of the circuit is determined by the time of the charging and discharging of the capacitor and a frequency modulator may be developed by varying the time of charging or discharging of the capacitor as a function of an input voltage. Such a circuit forms the subject matter of a copending application Serial No. 841,552, filed on September 22, 1959 by Walter T. Matzen entitled "Frequency Modulated Multivibrator" and assigned to the assignee of the present invention. In the circuit of the copending application the emitter electrode of one transistor is connected to a normally constant current load, which is variable in accordance with an input signal. In this manner the charging current of the capacitor is made a value which can be varied in accordance with an input signal. As a result of this control of charging current during one state of conduction of the multivibrator, the duration of one complete cycle is variable, and therefore the frequency is variable.

The circuit described above has the disadvantage that the duty cycle of the oscillator varies with changes in frequency. The present invention improves over the circuit disclosed in the aforesaid copending application by providing frequency modulation with a constant duty cycle.

According to the invention, a Zener diode is employed to stabilize the switching voltage of the multivibrator and constant current loads are provided for controlling the charging current of the capacitor during both states of conduction of the multivibrator. Means are provided to control these currents in accordance with an input signal. The above modifications of the frequency modulator of the aforesaid copending application provide a circuit which is highly stable over extended periods of operation, which has a frequency versus input voltage characteristic that is a substantially linear function of input voltage, and in which the duty cycle is a predeterminable and constant value. In addition to these advantages, means are provided to make the frequency temperature insensitive.

Further objects and advantages of the present invention will become apparent upon consideration of the following detailed description of the preferred embodiment of the invention and when taken in conjunction with the single FIGURE of the drawings showing a schematic circuit diagram of the improved frequency modulator of the present invention.

As shown in the drawings, the multivibrator comprises two NPN transistors 1 and 11. The transistor 1 is provided with an emitter 3, a base 2, and a collector 6. The transistor 11 is provided with an emitter 14, a base 12, and a connector 16. The emitter electrodes 3 and 14 are connected through diodes 36 and 37, respectively, to the terminals of capacitor 18, with the anodes of the diodes 36 and 37 being connected to the emitters. The diodes 36 and 37 serve the function of protecting the emitter-base junctions of the transistors 1 and 11 from excessive reverse voltages. The junction of the diode 36 and capacitor 18 is connected to collector electrode 38 of an NPN transistor 39, which has its emitter electrode 41 connected via a resistor 42 to a junction point 43 and its base electrode 44 connected via a lead 46 to base electrode 47 of an NPN transistor 48. The junction of the diode 37 and capacitor 18 is connected to collector electrode 49 of transistor 48, which has its emitter electrode 51 connected via a resistor 52 to the junction point 43. The junction point 43 is connected via a resistor 53 to ground and via a resistor 54 to a negative source of potential 56. The base electrodes 44 and 47 of the transistors 39 and 48, respectively, are further directly connected to emitter electrode 57 of an NPN transistor 58 having a collector electrode 59 connected to conductor 60. Base electrode 61 of transistor 58 is connected to a source of input signal voltage. A source of positive potential 9 is connected to the collector 6 of transistor 1 via a resistor 7 and to the collector 16 of transistor 11 via a resistor 17 to provide the collector voltages for the transistors 1 and 11. The source 9 is also connected to one end of a resistor 62. The other end of the resistor 62 is connected via a diode 63 to a lead 13 connected between the collector electrode 6 of the transistor 1 and the base electrode 12 of the transistor 11. The cathode electrode of the diode 63 is connected to the resistor 62 and is further connected to the cathode electrode of a Zener diode 64, which constitutes one of a string of three series connected Zener diodes. Diodes 66 and 67 comprise the remainder of this string of diodes. The anode electrode of the diode 67 is connected to ground and the diode 66 is connected between diodes 64 and 67. The junction of diodes 64 and 66 is connected via a diode 68 to the lead 13 with the anode electrode of diode 68 connected to the junction between the two Zener diodes. The junction of the diodes 66 and 67 is connected to the lead 60, which is connected to the collector electrode 59 of the transistor 58 and to the base electrode 2 of the transistor 1. This connection provides a reference voltage for the base electrode 2 and the collector voltage for the transistor 58. The output of the circuit is taken from the collector 16 of transistor 11.

The operation of the circuit is similar to that of the circuit described in the aforesaid copending application. The transistors 1 and 11 alternately conduct to generate the oscillations of the circuit. When the transistor 1 is conducting, current flows from the source 9 through resistor 7, transistor 1, and diode 36 to the junction between capacitor 18 and the collector 38 of transistor 39. The current divides at this junction with a portion flowing to the capacitor 18 and the remainder flowing to the collector 38 of transistor 39. The current flowing to the capacitor 18 causes an equal current to flow out from the other side of capacitor 18 to the collector 49 of transistor 48. At this point in the cycle, the capacitor 18 will be charged in such a direction that the current flowing into and out of the capacitor 18 discharges the capacitor 18. Because of the voltage drop through the resistor 7, the collector 6 of transistor 1 will be at a relatively low potential, which is applied to the base 12 of the transistor 11. The emitter 14 of the transistor 11 will be more positive than the base 12 due to the voltage across the charged capacitor 18, and thus the transistor 11 will be maintained in a non-conducting state during this part of the cycle. The capacitor 18 will continue to discharge in this manner until the potential at the emitter 14 of transistor 11 reaches that of the base 12, thus causing the transistor 11 to start conducting. The current from the emitter 14 of the transistor 11 opposes that part of the current flowing from the emitter 3 of transistor 1 into the capacitor 18. Therefore, when the transistor 11 starts conducting it causes a rise in the potential of the collector 6 of the transistor 1. This rise in potential is applied to base 12 of the transistor 11 causing an increase in the current flowing through transistor 11 further decreasing the current flow through transistor 1. Thus the action is cumulative and the transistor 11 is quickly switched into a fully conducting condition and the transistor 1 is switched to a fully non-conducting condition. The current now flows from the source 9 through resistor 17, the transistor 11, and the diode 37 and divides, a portion flowing into the capacitor 18 and the remainder flowing to the collector 49 of transistor 48. The current flowing into the capacitor 18 causes an equal current to flow out of the other side of capacitor 18 to the collector 38 of transistor 39. This current flowing into and out of capacitor 18 causes the capacitor 18 to recharge. As the capacitor 18 recharges, the voltage across it increases and this action causes a decrease in the potential at the emitter 3 of the transistor 1. The charging of capacitor 18 continues until the potential at the emitter 3 of transistor 1 reaches the potential of the base 2, at which time the transistor 1 begins again to conduct. When the transistor 1 starts to conduct the potential at the collector 6 drops. This drop in potential is applied to the base 12 of transistor 11, causing the current through transistor 11 to decrease. This action causes the emitter potential of the transistor 11 to fall. This drop in potential is applied to the emitter 3 of transistor 1 by the capacitor 18 causing an increase in the current through transistor 1. Thus the action is cumulative and the transistor 1 is switched quickly to a fully conducting condition and the transistor 11 is switched quickly to a fully non-conducting condition. A portion of the current flowing through transistor 1 again starts to discharge the capacitor 18 and the cycle repeats itself ad infinitum.

The Zener diodes 64, 66 and 67 constitute a voltage divider which is independent of the current flowing in the various parts of the circuit. The voltage across the diode 64 is connected via the oppositely poled diodes 63 and 68 to the lead 13 and therefore, the voltage at the cathode of the diode 64 constitutes the maximum voltage on the lead 13 and the voltage on its anode constitutes the minimum voltage on the lead 13. Specifically, if the voltage on lead 13 tends to rise above the voltage at the cathode of diode 64, the diode 63 conducts and clamps the voltage on lead 13. If the voltage tends to fall below that at the anode of diode 64, diode 68 conducts and clamps the voltage on lead 13. Thus, in that part of the cycle in which the transistor 1 conducts, the voltage on lead 13 will be clamped substantially at the value existing at the anode of diode 64, and, in that part of the cycle in which the transistor 11 conducts, the lead 13 will be clamped substantially at the potential existing at the cathode of diode 64. Therefore the voltage swing applied to the base of transistor 11 will substantially equal the voltage drop across diode 64. This fixing of the voltage swing applied to the base of transistor 11 causes the voltage swing across capacitor 18 to be fixed and to be substantially equal to the voltage drop across the diode 64. The reason for this effect will be understood from a discussion of what determines the voltage across the capacitor 18 when switching occurs. When the transistor 1 is conducting, the potential at the emitter 3 will substantially equal the constant potential applied to the base 2. The capacitor 18 then discharges until the potential at the emitter 14 of the transistor 11 equals the potential at the base 12, which is then substantially equal to the potential at the anode of diode 64. Therefore the voltage drop across the capacitor 18 must substantially equal the voltage drop across the diode 66 at this point in the cycle. Therefore when the transistor 11 first starts to conduct and the transistor 1 stops conducting, this voltage will be across the capacitor 18. Since the transistor 11 now conducts, the potential at the emitter 14 will substantially equal that of the base 12, which now substantially equals that at the cathode of diode 64. The capacitor 18 will now charge until the emitter 3 of transistor 1 equals the potential at the base 2. When this equality occurs, the capacitor 18 will have a voltage across it equal to the potential drop through both diodes 64 and 66. Thus the voltage swing across the capacitor 18 is substantially equal to the voltage drop across diode 64. Any change in the potential at the base 2 of transistor 6 will only have a temporary effect on this voltage swing during the time that the change occurs, because with a constant voltage applied to the base 2 of transistor 1, regardless of what it is, within limits, the voltage swing across the capacitor 18 will substantially equal the voltage drop across diode 64.

The circuit connections of transistors 39 and 48 cause them to operate as normally constant current loads to the currents flowing to their collectors 38 and 49. The magnitudes of these constant currents are linearly related to potentials applied to the bases 44 and 47 of these transistors, which potential is substantially equal to the signal voltage applied to the base 61 of transistor 58. Thus the magnitudes of the normally constant currents flowing through the transistors 39 and 48 are linearly related to the input voltage applied to the base of the transistor 61.

In the preferred embodiment the transistors 39 and 48 are selected and adjusted so that the current flowing through transistor 39 will equal the current flowing through transistor 48, regardless of the value of input signal voltage within limits. Since the transistors 39 and 48 present constant current loads to the charging and discharging currents of capacitor 18 and since the voltage swing across the capacitor 18 is independent of the magnitude of these currents, the durations of the charging and discharging parts of the cycle will be directly proportional to the magnitude of the constant currents and therefore linearly related to the input signal. Therefore the output frequency will be linearly related to input signal voltage. The duty cycle will be 50 percent and it will not vary with changes in frequency.

If a duty cycle other than 50 percent is desired, then the constant currents flowing through transistors 39 and 48 will have to be selected according to the desired ratio. To maintain a constant duty cycle with different frequencies and a linear relationship between the frequency and the input signal voltage, the transistors 39 and 48 must be selected and adjusted so that the ratio between the currents flowing through these two transistors is constant for the different input signal voltages.

Since the voltage drop across the diode 64 sets the voltage swing across capacitor 18, any change in the voltage drop across diode 64 with temperature will cause a change in the output frequency. However, the diodes 63 and 68 also provide a slight voltage drop, which changes with temperature and this change will counteract the change in the voltage drop through diode 64 with temperature. The diodes 63 and 68 accordingly are selected to precisely compensate for changes in the voltage drop through diode 64 with temperature. As a result the voltage swing on line 13 does not vary substantially with temperature and the frequency of oscillation does not vary substantially with temperature.

The preferred embodiment of the invention described above makes use of transistors. The invention is also applicable to multivibrators using vacuum tubes or other equivalents of the transistor as the active circuit elements. Many modifications may be made to the specific embodiment of the invention described above without departing from the spirit and scope of the invention, which is limited only as defined in the appended claims.

What is claimed is:

1. In a free running multivibrator circuit of the type having first and second transistors with the base of said second transistor driven by the collector of the said first transistor and a capacitor connected between the emitters of said transistors, the frequency of oscillation being determined by the time it takes for the voltage across said capacitor to swing back and forth between two values, the improvement wherein the loads connected to the junctions between said emitters and said capacitor are normally constant current loads and wherein there is provided means to vary the value of the normally constant currents of said loads while maintaining constant the ratio between said normally constant currents, a Zener diode connected to operate in its Zener region, a first rectifying diode having its cathode connected to the cathode of said Zener diode and its anode connected to the base of said second transistor, and a second rectifying diode having its anode connected to the anode of said Zener diode and its cathode connected to the base of said second transistor.

2. In a free running multivibrator circuit of the type having first and second transistors with the base of said second transistor driven by the collector of the said first transistor and a capacitor connected between the emitters of said transistors, the frequency of oscillation being determined by the time it takes for the voltage across said capacitor to swing back and forth between two values, the improvement wherein the loads connected to the junctions between said emitters and said capacitor are normally constant current loads and wherein there is provided means to vary the value of the normally constant currents of said loads while maintaining constant the ratio between said normally constant currents, a Zener diode connected to operate in its Zener region, a first rectifying diode having its cathode connected to the cathode of said Zener diode and its anode connected to the base of said second transistor, and a second rectifying diode having its anode connected to the anode of said Zener diode and its cathode connected to the base of said second transistor, said rectifying diodes being selected to compensate for thermal changes in the voltage drop through said Zener diode so that the voltage swing at the base of said second transistor remains constant with changes in temperature.

3. A multivibrator circuit comprising first and second transistors, each of said transistors having a base, an emitter and a collector, first and second constant current devices, the emitters of said first and second transistors being connected to said first and second constant current devices, the collectors of said first and second transistors being connected separately to a voltage supply through load impedance means, a capacitor coupled between the emitters of said first and second transistors, a first source of a first constant potential, unidirectional conductive means connecting said base of said first transistor to said first source, a second source of a second constant potential different from said first constant potential, unidirectional conductive means connecting said base of said first transistor to said second source, said base of said first transistor being connected to the collector of said second transistor, and biasing means connected to the base of said second transistor.

4. A multivibrator circuit comprising first and second transistors, each of said transistors having a base, an emitter and a collector, a voltage supply, the collectors of said first and second transistors being connected separately to said voltage supply through load resistors, a capacitor connected between the emitters of said first and second transistors, first and second constant current devices which are variable in magnitude in unison according to a common input voltage, the emitters of said first and second transistors being connected separately to said first and second constant current devices, the collector of said first transistor being connected to the base of said second transistor, the base of said first transistor being connected to a point of reference potential, a first voltage source, a diode connecting the collector of said first transistor to said first voltage source, a second voltage source having a magnitude different from said first voltage source, and another diode connecting the collector of said first transistor to said second voltage source.

5. A multivibrator circuit comprising first and second transistors, each of said transistors having a base, an emitter and a collector, a voltage supply, the collectors of said first and second transistors being connected separately to said voltage supply through load resistors, a capacitor connected between the emitters of said first and second transistors, first and second constant current devices which are variable in magnitude in unison according to a common input voltage, the emitters of said first and second transistors being connected separately to said first and second constant current devices, the collector of said first transistor being connected to the base of said second transistor, the base of said first transistor being connected to a point of reference potential, a resistor and a pair of Zener diodes connected in series in the order named between said voltage supply and said point of reference potential, a diode connecting the collector of said first transistor to the juncture of said resistor and one of said Zener diodes, and another diode connecting the collector of said first transistor to the juncture of said pair of Zener diodes.

References Cited in the file of this patent

UNITED STATES PATENTS

| | | |
|---|---|---|
| 2,750,502 | Gray | June 12, 1956 |
| 2,767,378 | Hass | Oct. 16, 1956 |
| 2,894,215 | Toy | July 7, 1959 |
| 2,929,030 | Wier | Mar. 15, 1960 |
| 2,938,172 | Gordon | May 24, 1960 |